(12) United States Patent
Zhao et al.

(10) Patent No.: US 8,516,695 B2
(45) Date of Patent: *Aug. 27, 2013

(54) METHOD FOR FORMING A CIRCUIT BOARD VIA STRUCTURE FOR HIGH SPEED SIGNALING

(75) Inventors: Shiyou Zhao, Boise, ID (US); Houfei Chen, Boise, ID (US); Hao Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/190,597

(22) Filed: Jul. 26, 2011

(65) Prior Publication Data

US 2011/0277323 A1   Nov. 17, 2011

Related U.S. Application Data

(60) Continuation of application No. 12/699,428, filed on Feb. 3, 2010, now Pat. No. 7,992,297, which is a division of application No. 11/533,005, filed on Sep. 19, 2006, now Pat. No. 7,676,919, which is a division of application No. 11/114,420, filed on Apr. 26, 2005, now abandoned.

(51) Int. Cl.
*H01K 3/10* (2006.01)

(52) U.S. Cl.
USPC ............................... 29/852; 29/846; 29/853

(58) Field of Classification Search
USPC .................. 29/852, 828, 846, 847, 849, 851, 29/853; 174/250, 255, 259, 262, 266
See application file for complete search history.

(56) References Cited

U.S. PATENT DOCUMENTS

| | | |
|---|---|---|
| 5,421,083 A | 6/1995 | Suppelsa et al. |
| 5,949,030 A | 9/1999 | Fasano et al. |
| 6,479,764 B1 | 11/2002 | Frana et al. |
| 6,717,059 B2 | 4/2004 | Shintani et al. |
| 6,787,710 B2 | 9/2004 | Uematsu et al. |
| 6,789,241 B2 | 9/2004 | Anderson et al. |
| 6,796,028 B2 | 9/2004 | Ahmad |
| 6,800,814 B2 | 10/2004 | Ohsaka |
| 6,809,267 B1 | 10/2004 | Kurita et al. |
| 6,812,412 B2 | 11/2004 | Obata et al. |
| 7,992,297 B2 | 8/2011 | Zhao et al. |
| 2002/0179332 A1 | 12/2002 | Uematsu et al. |
| 2003/0098179 A1 | 5/2003 | Obata et al. |
| 2003/0188889 A1 | 10/2003 | Straub et al. |

(Continued)

OTHER PUBLICATIONS

Houfei Chen et al., "Coupling of Large Numbers of Vias in Electronic Packaging Structures and Differential Signaling," IEEE MTT-S International Microwave Symposium, Seattle, WA, Jun. 2-7 (2002).

(Continued)

*Primary Examiner* — Thiem Phan
(74) *Attorney, Agent, or Firm* — Schwegman, Lundberg & Woessner, P.A.

(57) ABSTRACT

One embodiment of the invention comprises an improved method for making a via structure for use in a printed circuit board (PCB). The via allows for the passage of a signal from one signal plane to another in the (PCB), and in so doing transgresses the power and ground planes between the signal plane. To minimize EM disturbance between the power and ground planes, signal loss due to signal return current, and via-to-via coupling, the via is shielded within two concentric cylinders, each coupled to one of the power and ground planes.

11 Claims, 11 Drawing Sheets

(56) References Cited

U.S. PATENT DOCUMENTS

2005/0183883 A1 8/2005 Bois et al.
2006/0065432 A1 3/2006 Kawauchi et al.
2006/0076160 A1 4/2006 Hsu et al.
2006/0237227 A1 10/2006 Zhao et al.
2007/0007031 A1 1/2007 Zhao et al.
2010/0132191 A1 6/2010 Zhao et al.

OTHER PUBLICATIONS

Thomas Neu, "Designing Controlled Impedance Vias," at 67-72, EDN (Oct. 2, 2003).

"PCB/Overview," published at www.ul.ie/~rinne/ee6471/ee6471%20wk11.pdf (Apr. 11, 2004).

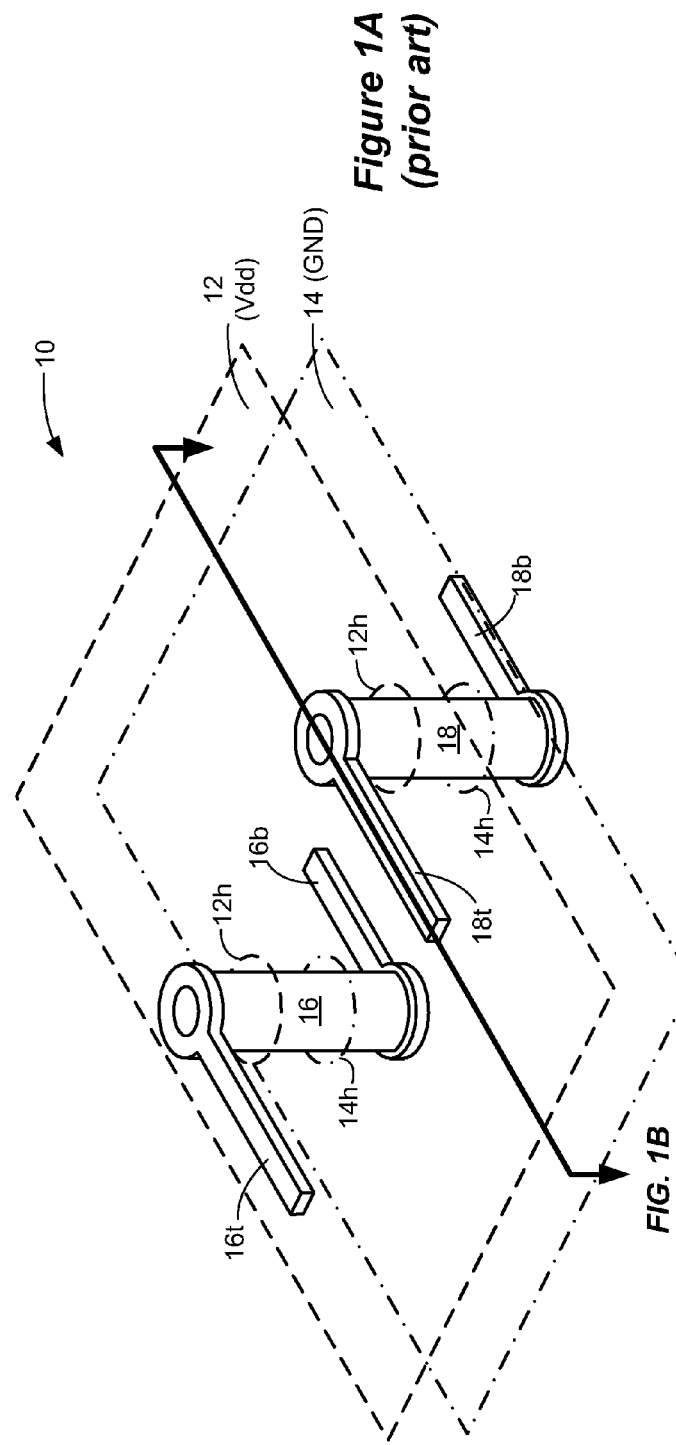
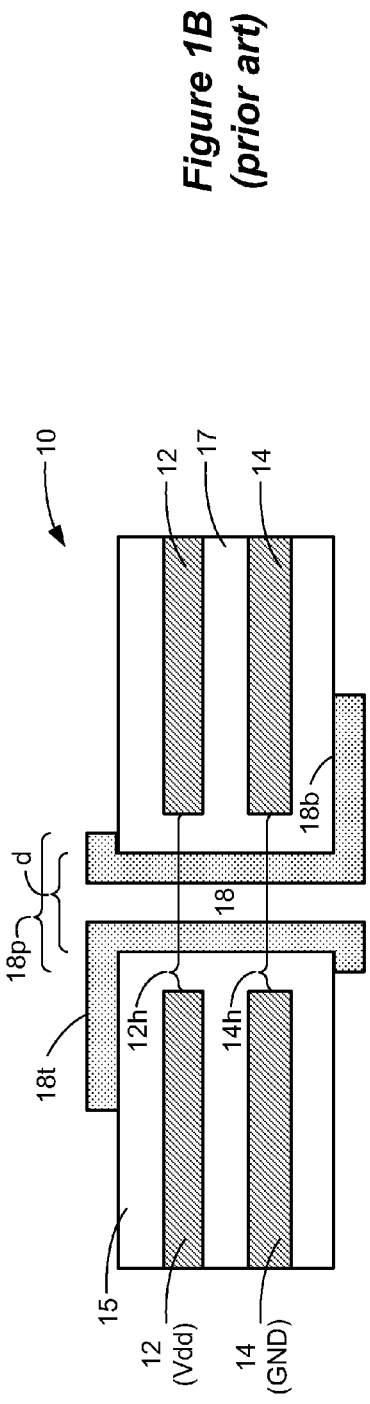

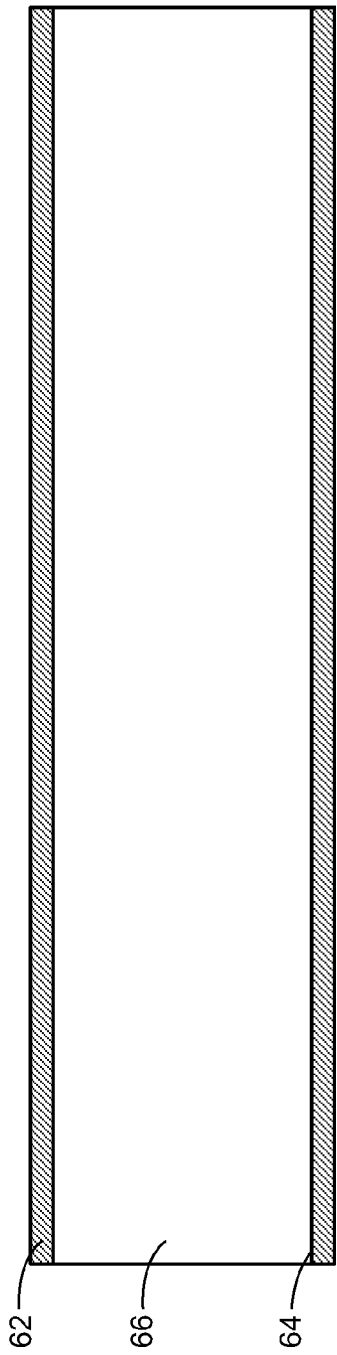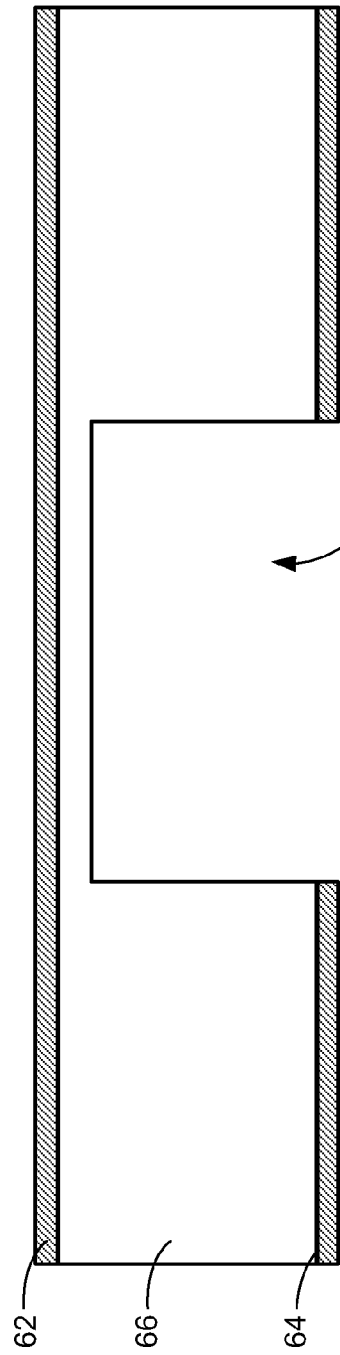

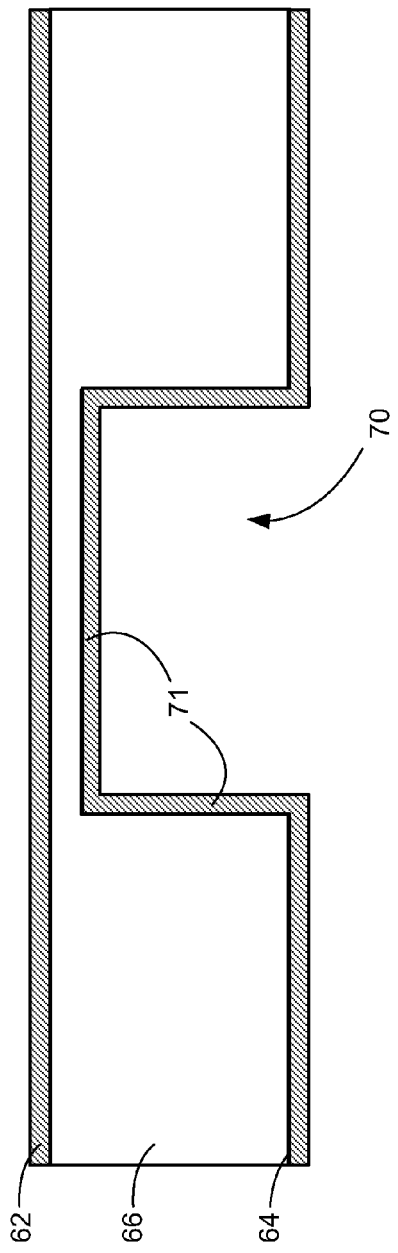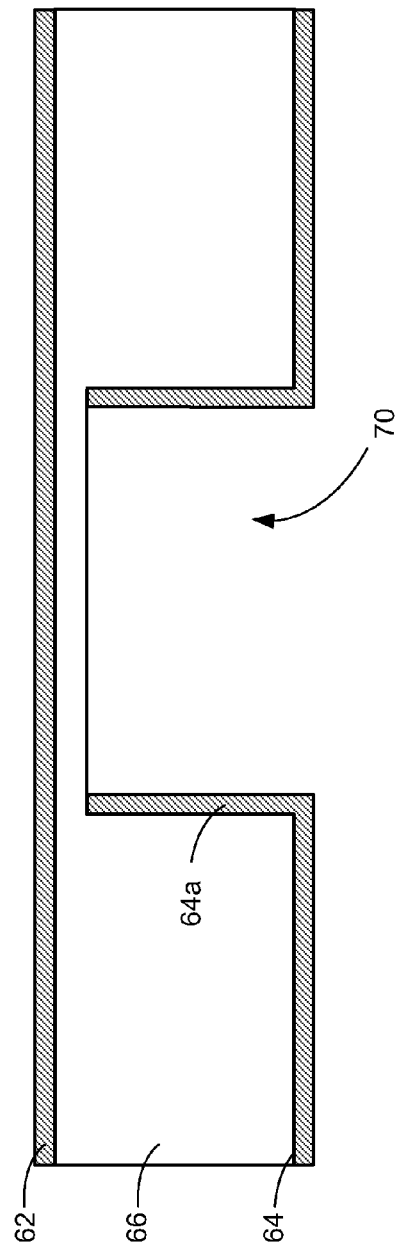
Figure 5C
Figure 5D

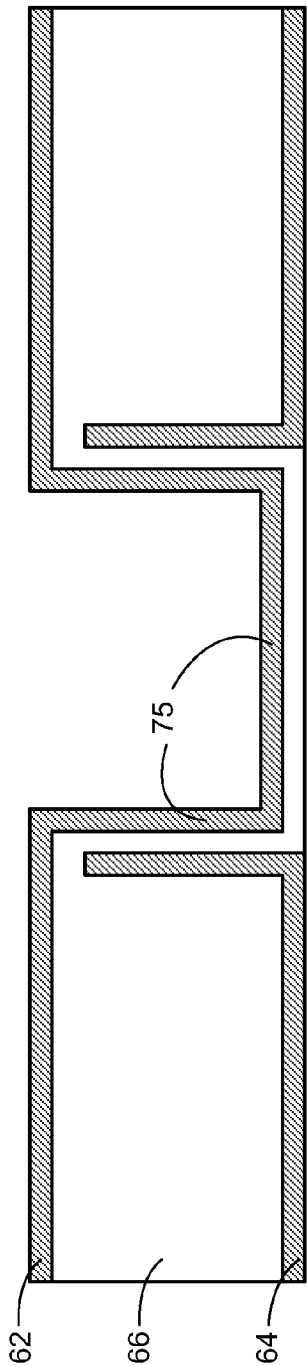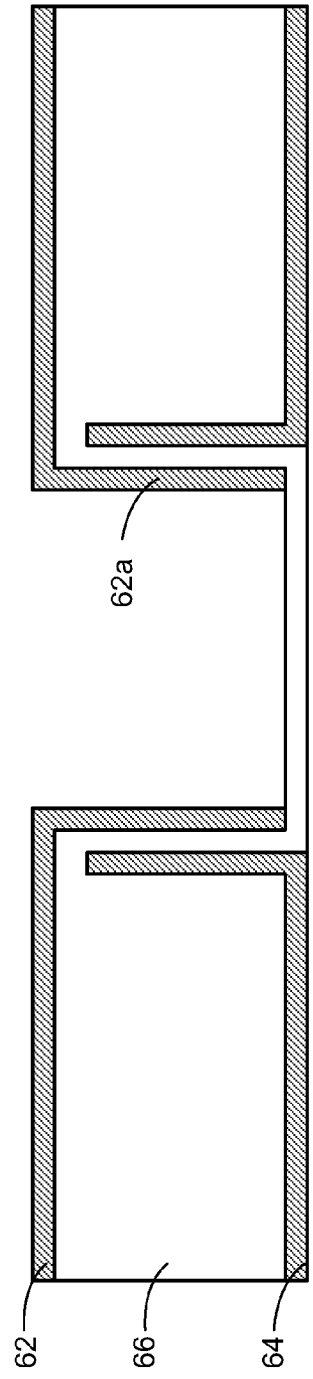
*Figure 5G*
*Figure 5H*

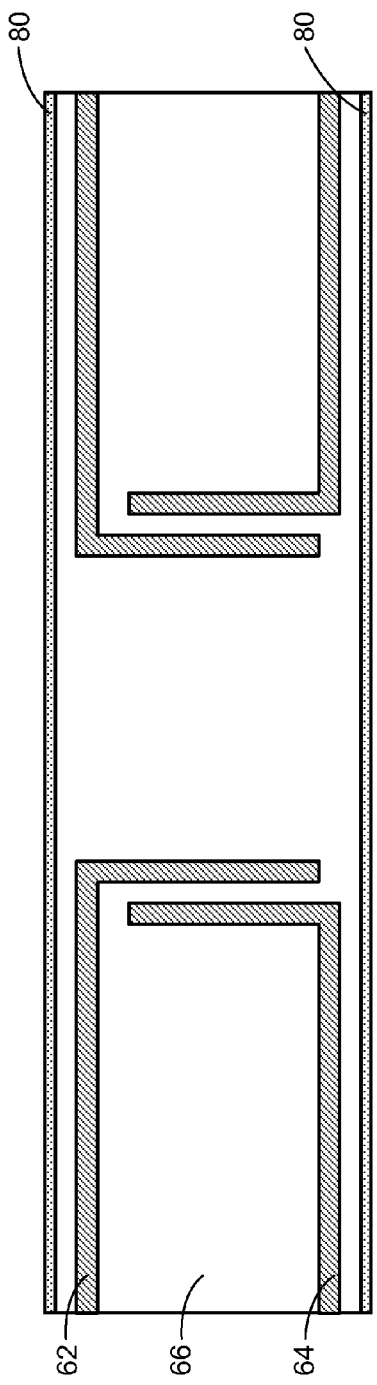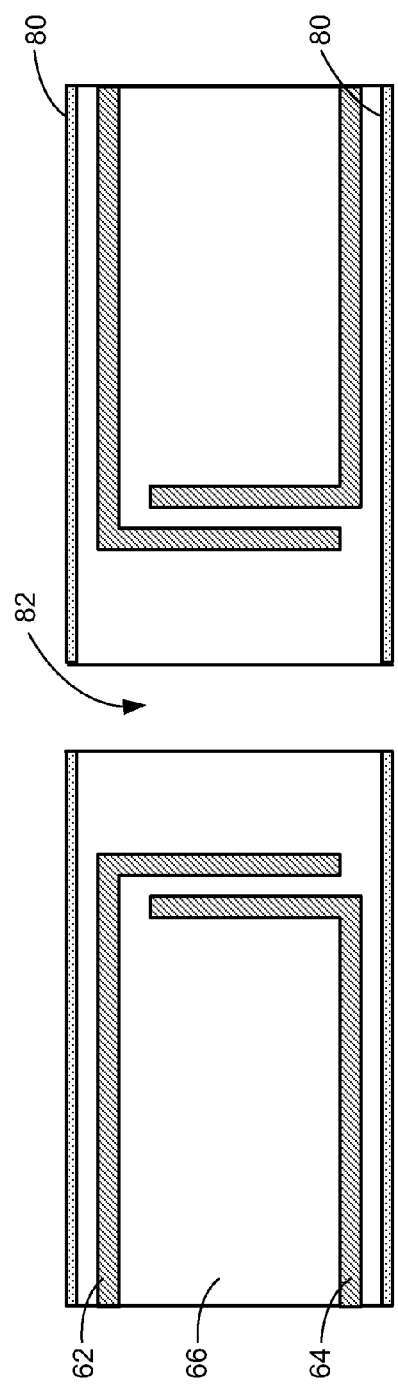
Figure 5K
Figure 5L

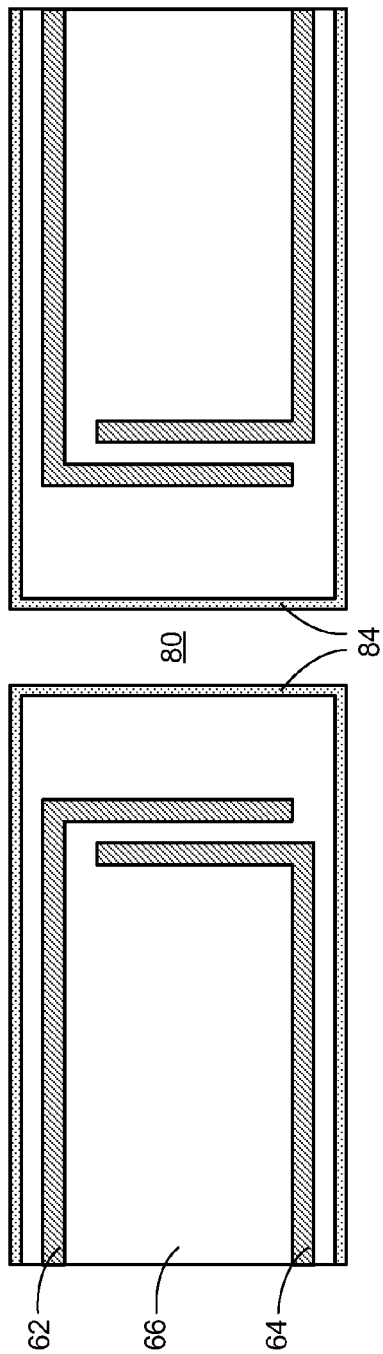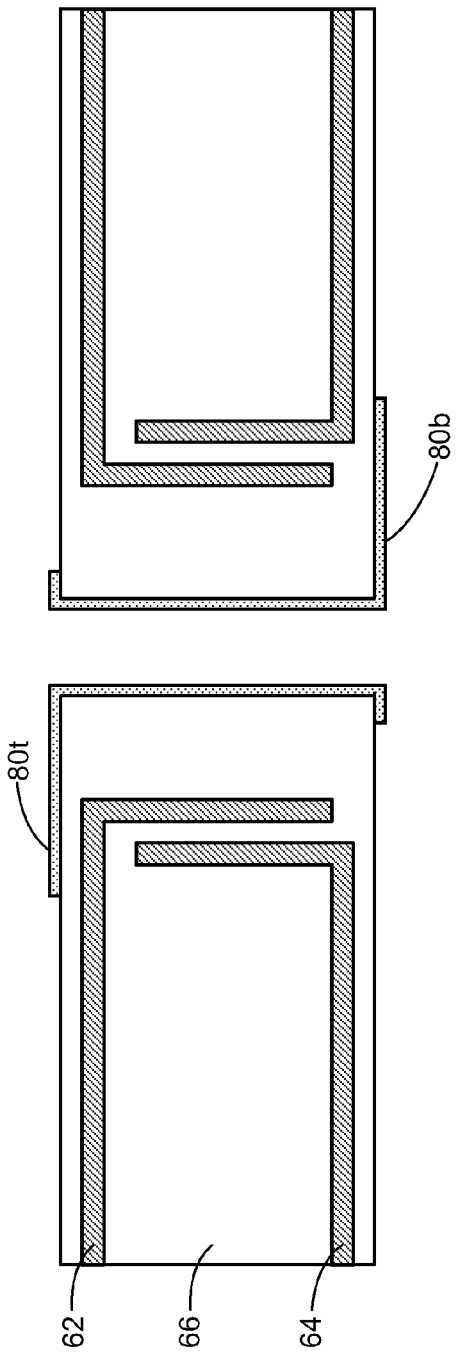

METHOD FOR FORMING A CIRCUIT BOARD VIA STRUCTURE FOR HIGH SPEED SIGNALING

CROSS REFERENCE TO RELATED APPLICATIONS

This application is a continuation of U.S. patent application Ser. No. 12/699,428, filed Feb. 3, 2010, which is a divisional of U.S. patent application Ser. No. 11/533,005, filed Sep. 19, 2006 (now U.S. Pat. No. 7,676,919), which was in turn a divisional of U.S. patent application Ser. No. 11/114,420, filed Apr. 26, 2005 (abandoned). Priority is claimed to these applications, and all are incorporated herein by reference in their entireties. Furthermore, this application relates to U.S. Pat. No. 7,459,638, entitled "Absorbing Boundary for a Multi-Layer Circuit Board Structure," which is incorporated herein by reference in its entirety.

FIELD OF THE INVENTION

Embodiments of this invention relate to printed circuit boards, and in particular to an improved via structure for providing signal integrity improvement.

BACKGROUND

In a multilayer printed circuit board (PCB), there are occasions that signals have to switch signaling planes in the PCB. FIGS. 1A and 1B illustrate such signal plane switching. As best shown in the cross sectional view of FIG. 1B, a signal trace 18$t$ originally proceeding on the top of a PCB 15 meets with a via 18 appearing through the PCB 15 and down to another signal trace 18$b$ on the bottom of the PCB 15. Thus, by use of the via 18, the signal trace is allowed to change planes in the printed circuit board, which can facilitate signal routing.

Also present in the PCB 15 are power (i.e., Vdd) and ground planes, respectively numbered as 12, 14, and referred to collectively as "power planes." These power planes 12, 14 allow power and ground to be routed to the various devices mounted on the board (not shown). (Although shown with the power plane 14 on top of the ground plane 12, these planes can be reversed). When routing a signal through these power planes, it is necessary to space the via 18 from both planes 12, 14, what is referred to as an antipad diameter 12$h$, 14$h$. The vias themselves at the level of the signal planes have pads to facilitate routing of the signals 18$t$, 18$b$ to the via, which have a pad diameter (18$p$) larger than the diameter of the via 18 itself (d). Typical values for the diameter of the via (d), the pad diameter (18$p$) and the antipad diameter (12$h$, 14$h$) are 16, 20, and 24 mils respectively. It should be understood that an actual PCB 15 might have several different signal and power planes, as well as more than two signal planes, although not shown for clarity.

When a signal trace such as 18$t$, 18$b$ switches signal planes, the signal return current—a transient—will generate electromagnetic (EM) waves that propagate in the cavity 17 formed between the power and ground planes 12, 14. Such EM waves will cause electrical disturbance on the signal being switched, as well as other signals traces. Such disturbances are especially felt in other near-by signals traces that are also switching signal planes, such as signal traces 16$t$, 16$b$ (FIG. 1A) due to coupling between the vias (i.e., 18 and 16). Moreover, such EM disturbances are significantly enhanced around the resonant frequencies of the power/ground cavity 17, which in turn are determined by the physical dimensions of the power planes 12, 14. Via-to-via coupling induced by signal plane switching can cause significant cross-talk, and can be particularly problematic for high frequency switching applications.

FIGS. 2 and 3, representing computer simulations on the structure of FIG. 1A, illustrate these problems. In these simulations, one of the signal lines (say, signal 16) is an "aggressor" through which a simulated signal is passed, and the other signal line (signal 18) is the "victim" whose perturbation is monitored. The simulations were run in HFSS™, which is a full-wave three-dimensional EM solver available from Ansoft Corporation of Pittsburgh, Pa. The simulations were run assuming a 2.0-by-0.4 inch PCB 15, a spacing of 100 mils between the two vias 16, 18, a height of 54 mils between the power planes 12, 14 defining the cavity 17, and use of an FR4 dielectric for the PCB 16 (with a dielectric constant of 4.2). Traces 16$t$, 16$b$, 18$t$, and 18$b$ were assumed to be microstrip lines with a characteristic impedance of 40 ohms. Via diameters, via pad diameters, and antipad diameters were assumed to have the values mentioned previously.

FIG. 2 shows the transmission coefficient of the aggressor signal, and significant signal loss is observed around certain resonant frequencies. The measured parameter is a scattering parameter (S-parameter), which is a standard metric for signal integrity and which is indicative of the magnitude of the EM disturbance caused by signal plane switching. FIG. 3 shows the coupling coefficient between the aggressor and victim signals. As can be seen, the coupling coefficient stands close to −10 db around all resonance frequencies, indicating significant cross-talk between the aggressor and the victim.

The prior art has sought to remedy these problems in a number of different ways. First, as disclosed in Houfei Chen et al., "Coupling of Large Numbers of Vias in Electronic Packaging Structures and Differential Signaling," IEEE MTT-S International Microwave Symposium, Seattle, Wash., Jun. 2-7 (2002), it was taught to surround vias of interest in a PCB with shielding vias. In U.S. Pat. No. 6,789,241, it was taught to place decoupling capacitors between the power and ground planes on a PCB at different locations. In Thomas Neu, "Designing Controlled Impedance Vias," at 67-72, EDN (Oct. 2, 2003), it was taught to minimize the impedance discontinuity caused by the via structure by adding four companion vias, all connected to ground planes. All of these references cited in this paragraph are hereby incorporated by reference.

However, these prior approaches suffer from drawbacks, as will be discussed in further detail later. In any event, the art would be benefited from strategies designed to minimize problems associated with signals switching signal planes in a printed circuit board. This disclosure provides such a solution in the form of an improved, shielded via structure.

SUMMARY

One embodiment of the invention comprises an improved via structure for use in a printed circuit board (PCB), and method for fabricating the same. The via allows for the passage of a signal from one signal plane to another in the (PCB), and in so doing transgresses the power and ground planes between the signal plane. To minimize EM disturbance between the power and ground planes, signal loss due to signal return current, and via-to-via coupling, the via is shielded within two concentric cylinders, each coupled to one of the power and ground planes.

BRIEF DESCRIPTION OF THE DRAWINGS

Embodiments of the inventive aspects of this disclosure will be best understood with reference to the following detailed description, when read in conjunction with the accompanying drawings, in which:

FIG. 1A illustrates a perspective view of two prior art vias both switching signal planes through power and ground planes.

FIG. 1B illustrates a cross section of one of the vias of FIG. 1A.

DETAILED DESCRIPTION

Figure 4:
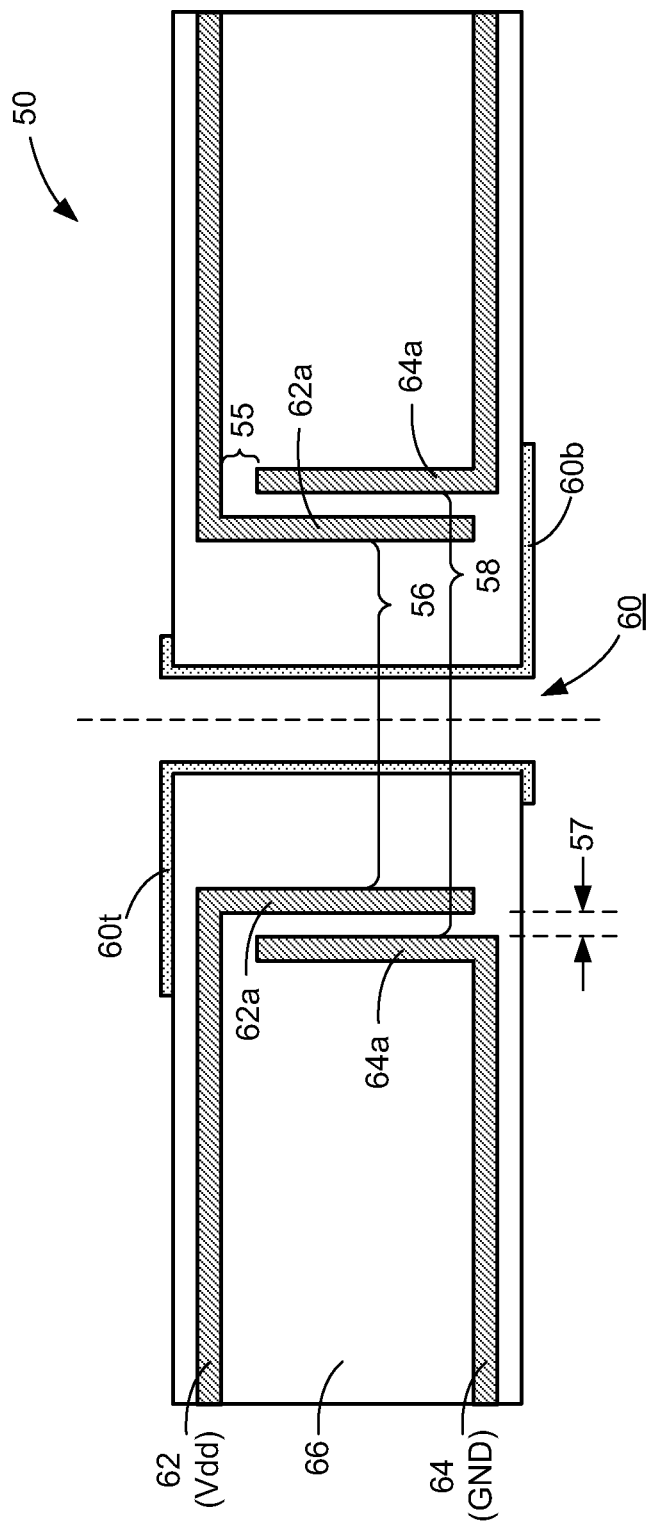
FIG. 4 illustrates a cross section of the disclosed improved via structure.

FIG. 4 shows an improved via structure 50 which alleviates the problem of signals switching signal planes through power planes. As shown, and similar to FIG. 1B, a signal 60 switches from the top (60t) to the bottom (60b) of the PCB 66 through via 60. Also similarly to FIG. 1B, power and ground planes 62 and 64 are present. However, in distinction to FIG. 1B, the power and ground planes 62 and 64 are coupled to concentric cylinders 62a and 64a (i.e., shields) around the via 60. Through this configuration, the cylinders 62a, 64a substantially encompasses the via in directions perpendicular to its axis 61, such that the cylinders are positioned in a dielectric perpendicularly to the plane of the PCB 66.

This via structure 50 facilitates signal transitioning from one plane to another by reducing the disturbances cause by return path discontinuities, particularly at high frequencies. Moreover, the via structure 50 suppresses via-to-via coupling otherwise caused by resonance between the ground and power planes 62, 64 at high frequencies, thereby improving signal integrity and reducing cross-talk from aggressor signals. The approach provides more efficient via shielding than the use of shielding vias, discussed in the background. Moreover, the disclosed approach performs better at high frequency than do approaches using decoupling capacitors, which otherwise suffer from relatively high effective series inductances that exist in decoupling capacitors, again as discussed in the background. As compared to prior art seeking to minimize the impedance discontinuity caused by the via, also discussed in the background, the disclosed approach is more flexible and realistic. In that prior art approach, both of the planes transgressed must be held at the same potential (i.e., ground or power). In short, that prior technique has no pertinence when signals have to change through both power and ground planes, as that technique would require shorting those planes together, which is not possible in a real working PCB. In short, it provides no solution for the problem addressed here of switching through power and ground planes. In short, the disclosed via structure has improved applicability to high-speed/high-frequency PCB designs, where signals have reduced timing and noise margins and increased energies.

Figure 2:
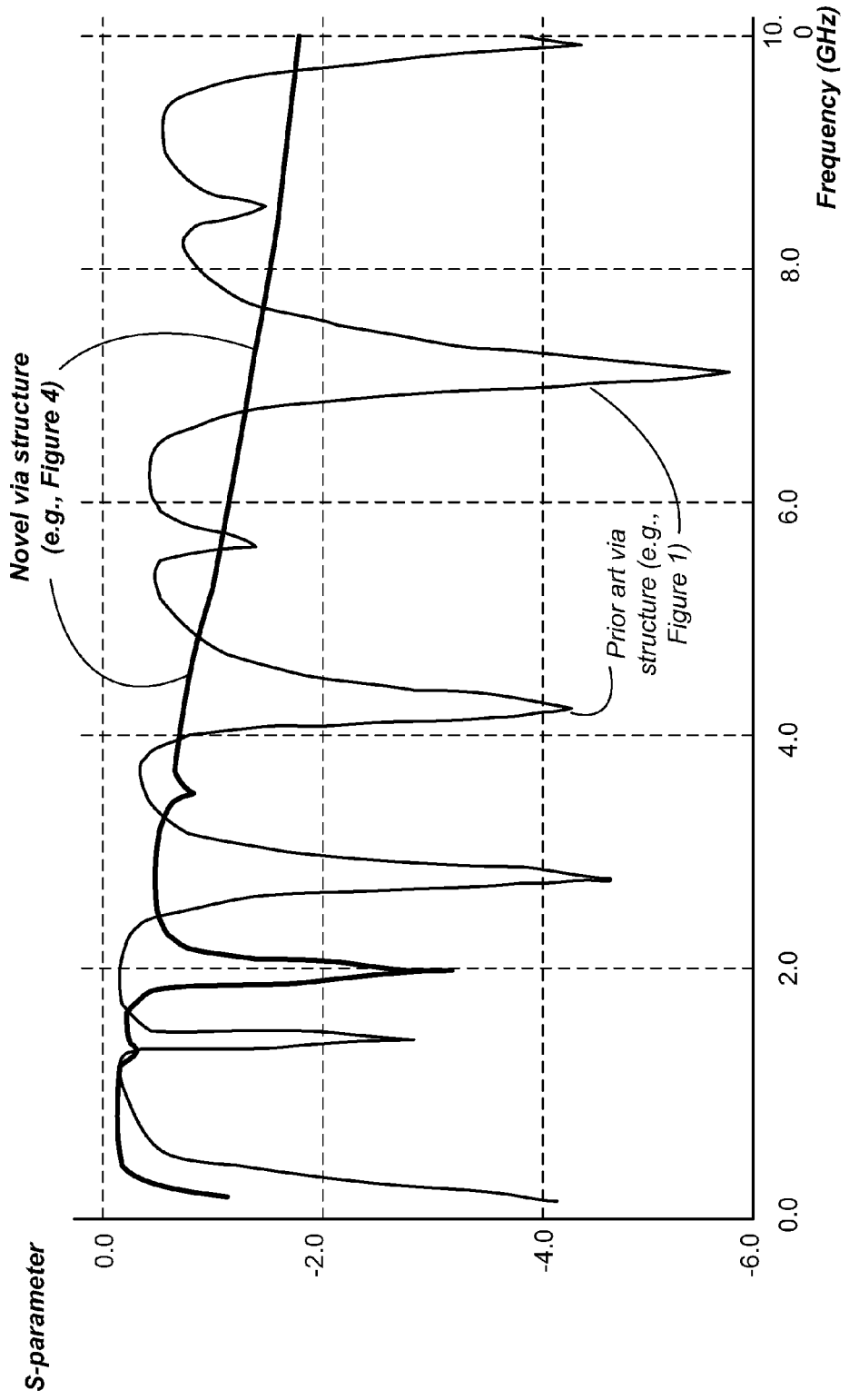
FIG. 2 illustrates signal loss (via S-parameters) as a function of frequency for both the prior art via of FIG. 1B and the disclosed via of FIG. 4.
Figure 3:
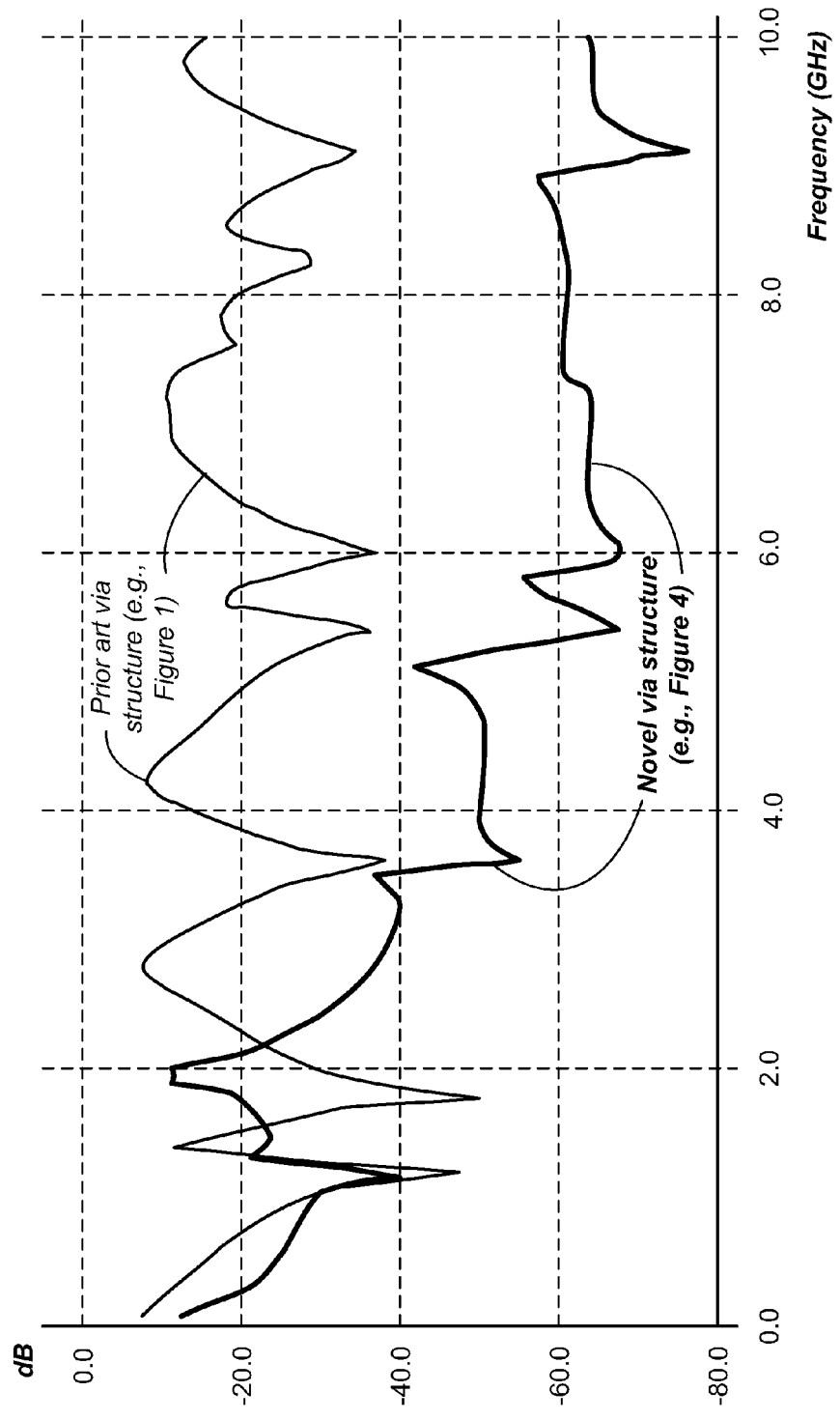
FIG. 3 illustrates via coupling (in dB) as a function of frequency for both the prior art via of FIG. 1B and the disclosed via of FIG. 4.

The improved performance is shown in FIGS. 2 and 3, which as discussed previously shows computer simulation results indicative of the magnitude of the EM disturbance caused by signal plane switching and cross-talk. Thus, referring again to FIG. 2, it is seen that the disclosed via structure 50 has an improved transmission coefficient (i.e., S-parameter), and does not generally suffer large "dips" in the transmission coefficient resulting from unwanted resonance in the cavity between the power planes. Moreover, and referring again to FIG. 3, it can be seen that cross-talk is greatly minimized, especially at higher frequencies. As modeled, the core via of FIG. 4 had the same core dimensions and materials of the via of FIG. 1 as discussed in the background, and had the following additional parameters: an inner power diameter 56 of 20 mils; an inner ground diameter 58 of 23 mils; cylinder wall thicknesses of 2 mils; a 1 mil dielectric thickness 57 between the cylinders; and a 3 mil vertical distance 55 between the top of the power cylinder 64a and the ground plane 62. (As such, it should be understood that the cross section of FIG. 4 is not drawn to scale). Of course, these values for the improved via structure 50 are merely exemplary, and can be changed depending on the environment in which the vias will operate. For example, the core via 60 can be made of a smaller diameter, and the cylinders 62a, 64a can be further spaced from core via 60.

As shown in FIG. 4, it is preferable to place the power and ground cylinders 62a, 64a as close as together to maximize the coupling between them. Preferably, the dielectric thickness 57 between the cylinders would not exceed 3 mils for the materials discussed herein.

Although the via structure 50 is shown in FIG. 4 with the power cylinder 62a within the ground cylinder 64a, it should be understood that the cylinders can be reversed with the same effect, i.e., with the ground cylinder 64a within the power cylinder 62a.

Manufacture of the disclosed via structure 50 can take place as illustrated in the sequential cross-sectional views of FIG. 5A-5N. Most of the individual steps involve common techniques well known in the PCB arts, and so are only briefly discussed. Further information on such steps are disclosed in "PCB/Overview" (Apr. 11, 2004), which is published at www.ulle/~rinne/ee6471/ee6471%20wk11.pdf, which is incorporated herein by reference in its entirety, and which is submitted with the Information Disclosure Statement filed with this application.

Starting with FIG. 5A, the starting substrate comprises a dielectric layer 66 which has been coated on both sides with a conductive material 62, 64, which comprises the power and ground planes. In a preferred embodiment, dielectric 66 is FR4, but could comprise any dielectric useable in a PCB. The conductive materials 62, 64 can also comprise standard PCB conductive materials.

In FIG. 5B, a hole 70 that will eventually encompass the cylinders is formed. Such a hole 70 can be formed by mechanical or laser drilling. Note that the hole 70 does not proceed through the entirety of the dielectric 66, but instead leaves a thickness akin to the thickness 55 (FIG. 4) in the finished via.

In FIG. 5C, the resulting structure is electrically plated to form line 71 the hole 70. Processes for electrical plating are well known in the art, and hence are not further discussed. Note that through this process the plating 71 couples to the ground plane 64. In FIG. 5D, the horizontal portion of the plating 71 is removed, which can occur using plasmas or wet chemical etchants. In this regard, it may be useful to employ a removable masking layer (not shown) over conductors 62, 64 to protect them against the etch step of FIG. 5D, which would then allow an anisotropic plasma etch to be used to remove only the horizontal portion of the plating 71. The resulting structure defines the outer cylinder 64a.

Figure 5E:
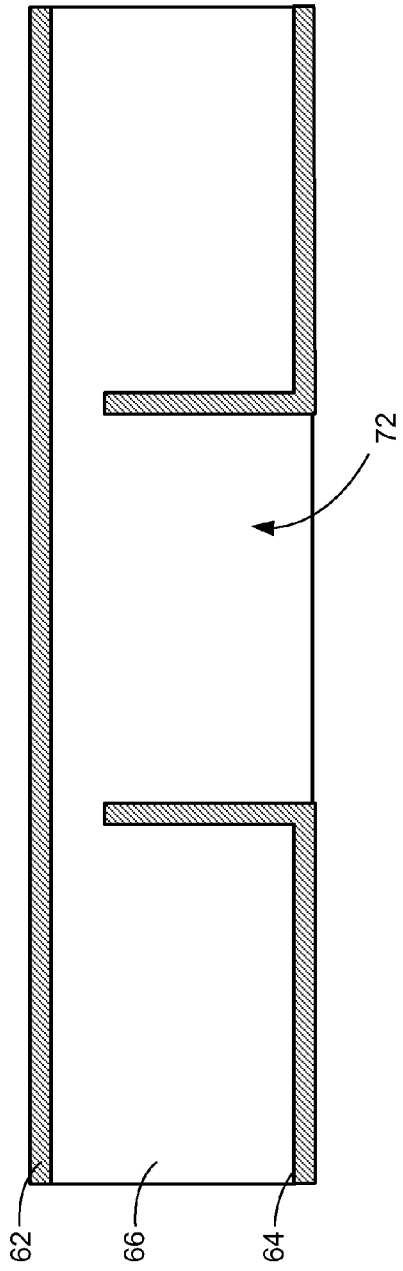
FIGS. 5A-5N illustrate sequential steps for the construction of the via of FIG. 4.
Figure 5F:
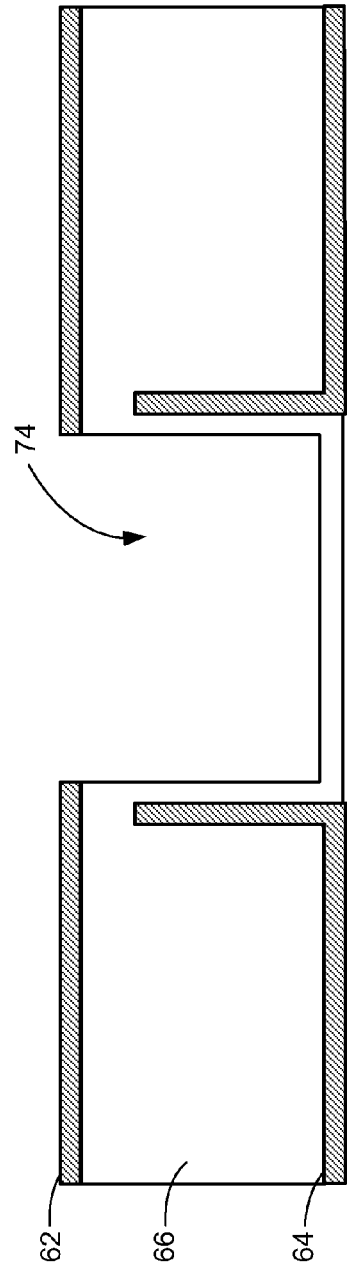
Figure 5I:
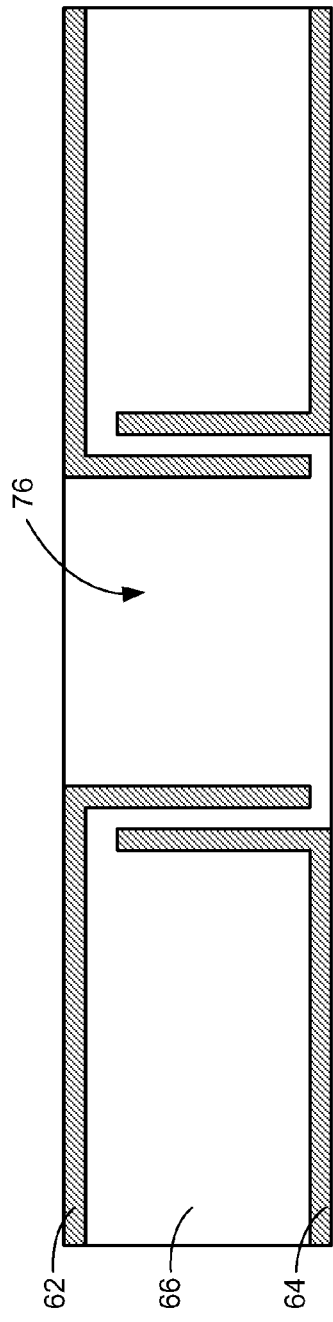

In FIG. 5E, the hole 70 is filled with another dielectric material 72. This dielectric material can be deposited either by chemical vapor deposition, or "spun on" to the substrate in liquid form and then hardened. Either way, the bottom side of the substrate might need to be planarized to remove unwanted portions of the dielectric material 72 from the surface of the ground plane 64.

FIGS. 5F-5I essentially mimic the steps of FIGS. 5B-5E (drilling, plating, etching, and dielectric filling), but occur on the top of the substrate and are relevant to the formation of the inner cylinder (i.e., 62a). As these steps are the same, they are not again discussed.

Figure 5J:
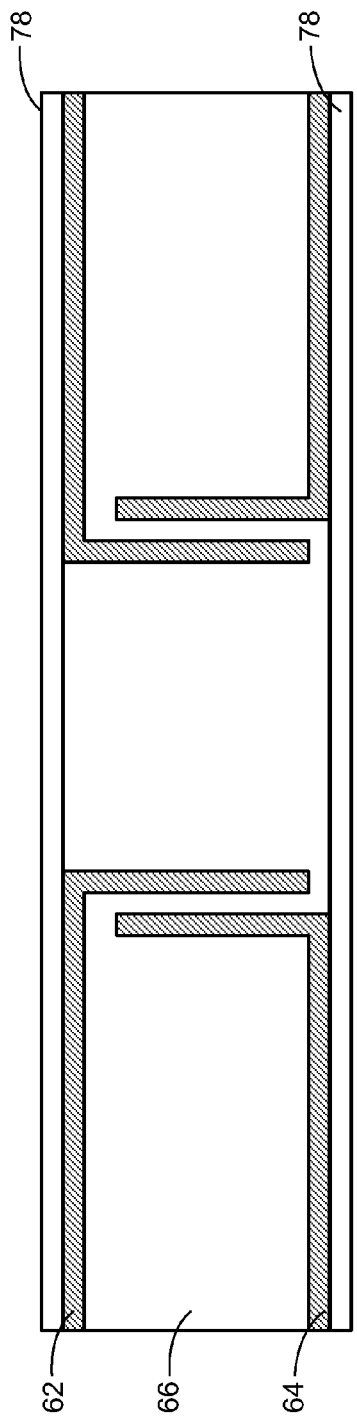

In FIG. 5J, sheets of a dielectric prepreg material 78 are adhered to the top and bottom of the substrate. The prepreg sheets 78 are heated and hardened to adhere them to the remaining substrate, which can occur in a hydraulic press. Once adhered, the prepreg forms the dielectric between the power planes/associated cylinders and the signal traces, as will become evident in the following Figures.

In FIG. 5K, a conductive material 80 for the signal traces is formed on both the top and bottom of the substrate. Again, plating and/or chemical vapor deposition can be used to form the conductive material 80.

In FIG. 5L, a hole 82 for the via is formed. Such hole may be mechanically drilled or formed by laser drilling.

In FIG. 5M, another conductive material 84 is placed on the sides of the hole 84 to form via 80, e.g., by plating and/or chemical vapor deposition. In so doing, the conductive material 84 contacts the top and bottom conductive material 80 deposited in FIG. 5K.

In FIG. 5N, the conductive material 80 is masked and etched using standard PCB techniques to form the necessary conductors on the top and bottom of the substrate. In particular, and as shown, top and bottom conductors 80t, 80b are formed, thus forming, in conjunction with the via 80, a signal which switches signal planes through the power planes, i.e., the problematic configuration discussed above. However, the dual-shield configuration minimizes the effects of EM disturbance.

The disclosed via structure 50 is susceptible to modifications. It is preferable that the shields 62a, 64a are circular and concentric, as this geometry is easiest to manufacture. However, useful embodiments of the invention need not be either circular or concentric. For example, the shields 62a, 64a can take the form of squares, rectangles, ovals, etc., and additionally need not be perfectly concentric to achieve improved performance. The dielectric material (72; FIG. 5E) between the cylinders 62a, 64a need not be FR4, but could comprise other high dielectric constant materials other than those mentioned. Finally, the number of shields can be increased. Thus, there could be three shields (e.g., with a ground shield nested between two power shields or vice versa), four shield (with alternating power and ground shields), or more.

Although particularly useful in the context of a printed circuit board, the disclosed technique could also be adapted to the formation of shielded vias for integrated circuits.

In short, it should be understood that the inventive concepts disclosed herein are capable of many modifications. To the extent such modifications fall within the scope of the appended claims and their equivalents, they are intended to be covered by this patent.

What is claimed is:

1. A method for forming a via, comprising:
   forming a first hole in a first side of a circuit board, wherein the first hole does not proceed through the entirety of the circuit board;
   forming a first cylinder on edges of the first hole;
   forming a second hole in a second side of the circuit board, wherein the second hole does not proceed through the entirety of the circuit board;
   forming a second cylinder on edges of the first hole, wherein the second cylinder is surrounded by the first cylinder and in contact with the second conductive layer; and
   forming a via in the circuit board, wherein the via passes through the second cylinder.

2. The method of claim 1, wherein the first cylinder is coupled to a first conductive layer on the first side.

3. The method of claim 2, wherein the second cylinder is coupled to a second conductive layer on the second side.

4. The method of claim 3, wherein the first conductive layer is coupled to one of a power supply voltage or a ground voltage, and wherein the second conductive layer is coupled to the other of the power supply voltage or the ground voltage.

5. The method of claim 3, wherein the via is coupled to a third conductive layer proximate to the first side, and is coupled to a fourth conductive layer proximate to the second side.

6. The method of claim 5, wherein the first, second, third and fourth conductive layers are parallel.

7. The method of claim 6, wherein the first and second conductive layers are between the third and fourth conductive layers.

8. The method of claim 1, wherein the first and second cylinders are separated by a dielectric.

9. The method of claim 1, further comprising filling the first hole with a dielectric after forming the first cylinder.

10. The method of claim 9, further comprising filling the second hole with a dielectric after forming the second cylinder.

11. The method of claim 1, wherein the first and second cylinders are concentric with the via.

\* \* \* \* \*